United States Patent [19]

Havemann et al.

[11] Patent Number: 5,003,365
[45] Date of Patent: Mar. 26, 1991

[54] BIPOLAR TRANSISTOR WITH A SIDEWALL-DIFFUSED SUBCOLLECTOR

[75] Inventors: Robert H. Havemann, Garland; Robert H. Eklund, Plano, both of Tex.

[73] Assignee: Texas Instruments Incorporated, Dallas, Tex.

[21] Appl. No.: 528,261

[22] Filed: May 24, 1990

Related U.S. Application Data

[63] Continuation of Ser. No. 204,644, Jun. 9, 1988, abandoned.

[51] Int. Cl.[5] .......................................... H01L 29/72
[52] U.S. Cl. ...................................... 357/34; 357/35; 357/43; 357/59
[58] Field of Search .................... 357/34, 42, 43, 59 H, 357/35

[56] References Cited

U.S. PATENT DOCUMENTS

| | | | |
|---|---|---|---|
| 3,913,124 | 10/1975 | Roberson | 357/59 H X |
| 4,673,962 | 6/1987 | Chatterjee et al. | 357/23.6 |
| 4,696,097 | 9/1987 | McLaughlin et al. | 357/59 H X |
| 4,733,287 | 3/1988 | Bower | 357/59 H X |
| 4,784,971 | 11/1988 | Chiu et al. | 357/59 H X |
| 4,792,837 | 12/1988 | Zazzu | 357/59 H X |
| 4,824,793 | 4/1989 | Richardson et al. | 437/47 |

OTHER PUBLICATIONS

Berger, "Method of Producing a Lateral Transistor," IBM Techical Disclosure, Bulletin, vol. 23, No. 3, Aug. 1980, pp. 1089-1090.

Primary Examiner—William Mintel
Attorney, Agent, or Firm—Melvin Sharp; James T. Comfort; Richard A. Stoltz

[57] ABSTRACT

A bipolar transistor with a subcollector diffused from a trench contact is disclosed. The bipolar transistor is formed by an n-type collector region disposed over a p-type substrate, or over a p-type epitaxial layer disposed over a p+ substrate. A trench is formed surrounding the transistor, with a dielectric layer formed on the sides and bottom of the trench. An opening is formed in the dielectric layer adjacent the collector region; the trench is filled with a dopant source such as heavily doped n-type polysilicon. During the diffusion of the base region from an implant, n-type dopant diffuses out from the filled trench through the opening, to form an n+ subcollector in the collector region. An emitter region, and an extrinsic base region, are then formed to complete the transistor. Additional disclosed embodiments include the use of an isolation structure to fill the trench on the side of the transistor adjacent the extrinsic base, so that collector-to-base capacitance is minimized. Additional disclosed embodiments also include formation of a p-n-p transistor with a similar diffused subcollector, and a transistor having an extrinsic base region similarly formed by diffusion from a filled trench.

29 Claims, 14 Drawing Sheets

5,003,365

BIPOLAR TRANSISTOR WITH A SIDEWALL-DIFFUSED SUBCOLLECTOR

This application is a continuation of application Ser. No. 07/204,644, filed June 9, 1988, now abandoned.

This invention is in the field of integrated circuits, and is more specifically directed to bipolar transistor structures.

BACKGROUND OF THE INVENTION

In the formation of integrated circuits using bipolar transistors, the use of subcollectors for purposes of reducing series collector resistance has become commonplace. Conventional subcollectors consist of buried heavily doped regions underlying a more lightly doped collector region of the same conductivity type as the subcollector The collector region may be formed by epitaxial silicon growth over the buried region. The intrinsic base region is then formed by implant and diffusion into the epitaxial layer over above the subcollector, and the emitter is formed by diffusion into the intrinsic base region. An extrinsic base region, consisting of a heavily doped region within the intrinsic base region, and of the same conductivity type, is often used to reduce the series base resistance of the device.

Of course, for the subcollector to serve as the collector of the bipolar transistor, contact must be made thereto. This typically is provided by making a surface contact to the more lightly doped epitaxial collector region. However, the contact to the epitaxial layer introduces series collector resistance between the surface contact and the subcollector, such series collector resistance being in addition to the series resistance of the collector region between the intrinsic base and the subcollector. A less resistant contact may be made by using a deep diffusion from the surface of the structure, reaching fully to the subcollector region. Such a contact requires a long drive-in diffusion for the dopant to diffuse from its implanted or deposited location to fully extend from the surface to the subcollector. This long diffusion also results in significant lateral diffusion of the dopant, which not only increases the surface area required for the implementation of the transistor, but also reduces the ability to scale the transistor to smaller geometries.

Furthermore, for conventional bipolar transistors which have a subcollector region which fully extends under both the intrinsic and extrinsic base regions, the base-to-collector capacitance is high, due to the proximity of the heavily doped extrinsic base region to the heavily doped subcollector of opposite conductivity type lying directly thereunder.

As noted above, the conventional process for bipolar transistors having a buried region is by doping the substrate, via ion implant, prior to epitaxial growth of the collector region. However, since epitaxial growth is a relatively high temperature step, which takes significant time, the dopant implanted for the buried region will diffuse in all directions from its implanted location. The additional vertical diffusion will tend to decrease the collector-to-base breakdown voltage of the bipolar transistor, and the lateral diffusion of the buried region from the epitaxial growth will increase the required spacing between the location of the subcollector and circuitry which is to have a separate subcollector, or which is not to have a subcollector. Both of these effects limit the scalability of the transistors.

Integrated circuits which have bipolar transistors and MOS transistors of both channel conductivity types formed into the same substrate may have both n-type and p-type buried regions therein, such as described in copending applications Ser. Nos. 129,261 and 129,271, both filed Dec. 7, 1987 and assigned to Texas Instruments Incorporated. Accordingly, the lateral diffusion of the buried regions of both conductivity types during epitaxy requires increased spacing therebetween as compared to the spacing for a single subcollector device. The diffusion which is used to form the well regions in the epitaxial layers over the buried regions will also further diffuse the buried regions, further increasing the required spacing.

It is an object of this invention to provide a bipolar transistor having a high conductivity surface contact to a buried subcollector.

It is another object of this invention to provide such a transistor which has its subcollector formed subsequent to the formation of the epitaxial layers.

It is another object of this invention to provide such a transistor which does not have a subcollector region directly under its extrinsic base diffusion.

It is another object of this invention to provide such a transistor which has its subcollector formed by a process compatible with the formation of MOS transistors on the same substrate.

Other objects and advantages of the invention will become apparent to those of ordinary skill in the art having reference to the following specification in conjunction with the drawings.

SUMMARY OF THE INVENTION

The invention may be incorporated into a bipolar transistor structure formed at a surface of a semiconductor substrate. The collector region is formed on a substrate of opposite conductivity type, without a buried layer The subcollector contact is formed by a trench etched through the collector region surrounding the transistor, and which has a dielectric layer on all sides and the bottom thereof, except at a location near the bottom of the collector region. Heavily doped polysilicon of the same conductivity type as the collector region fills the trench. The subcollector is formed by diffusion of dopant from the heavily doped polysilicon through the sidewall location not having a dielectric layer thereat. If the entire perimeter of the transistor is not desired to have subcollector formation, portions of the trench may be filled with an oxide, or with a polysilicon plug isolated from the subcollector contact by oxide.

DETAILED DESCRIPTION OF THE PREFERRED EMBODIMENTS

Figure 1:
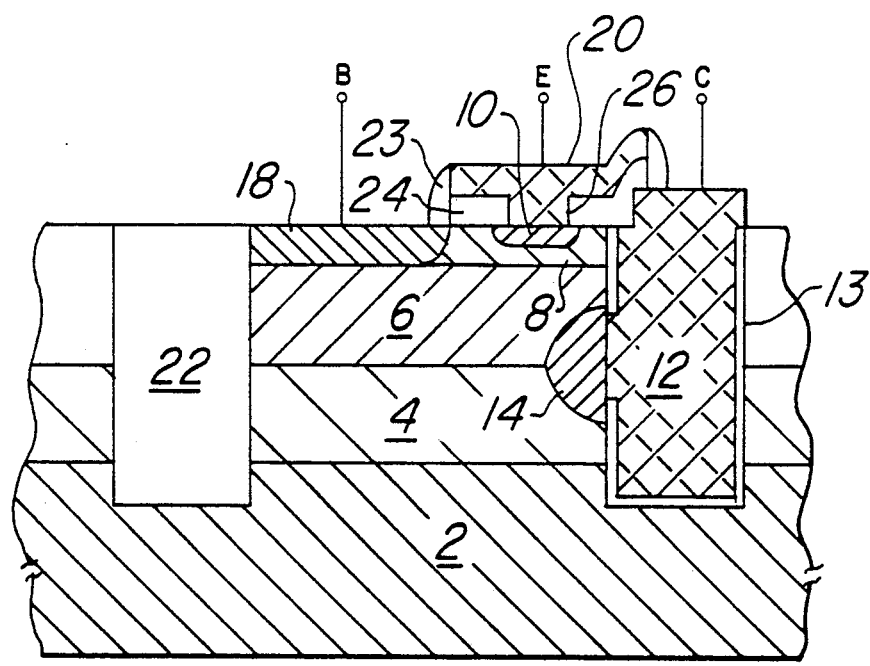
FIG. 1 is a cross-sectional view of a transistor formed according to a first embodiment of the invention.

Referring now to FIG. 1, a cross-sectional view of a transistor constructed according to a first embodiment of the invention is illustrated. The transistor of FIG. 1 is formed on a p+ substrate 2, upon which is formed a more lightly doped p-type epitaxial layer 4. For purposes of this invention, the provision of the heavily doped p+ substrate 2 is not essential, and the entire structure may be formed in a more lightly doped p-type substrate such as is conventional for the formation of n-p-n bipolar integrated circuits. However, the use of a p+ substrate 2 underlying a p-type epitaxial layer 4 may be preferred for formation of a BiCMOS structure. Collector region 6 is a lightly doped n-type region which is formed in p-type epitaxial layer as will be described below. In a BiCMOS process, collector region 6 will be formed in conjunction with the n-well into which p-channel MOS transistors may be formed. Disposed within collector region 6 is p-type intrinsic base region 8, and p+ extrinsic base region 18; extrinsic base 18 is useful for reducing the series resistance between the base contact and the active base region in intrinsic base 8. Disposed within intrinsic base region 8 is n+ emitter diffusion 10. For this example, emitter diffusion 10 is formed by autodiffusion from n+ doped polysilicon emitter electrode 20 which overlies intrinsic base region 8, separated therefrom by base oxide 24. The emitter diffusion 10 is formed by diffusion of the n-type dopant from electrode 20 through via 26. Sidewall oxide filaments 23 may be provided along the edges of emitter electrode 20; filaments 23 are especially useful for preventing collector-emitter and base-emitter shorting should silicidation of the diffusion and polysilicon regions be desired.

The structure of FIG. 1 has an n+subcollector 14 which underlies intrinsic base 8 and which is in contact with collector region 6. Contact is made to subcollector 14 by way of n+ doped polysilicon plug 12 which fills a trench, and which is isolated from substrate 2, from epitaxial layer 4, from collector region 6 and from intrinsic base 8 by way of dielectric layer 13, which is typically silicon dioxide. An opening is formed in dielectric layer 13 proximate collector region 6, through which subcollector 14 is formed by outdiffusion from polysilicon plug 12 into collector region 6; diffusion into epitaxial layer 4 may also occur, such diffusion not being significantly detrimental to the performance of the structure. Polysilicon plug 12 is thus in contact with subcollector 14 through the opening in dielectric layer 13. An isolation trench contains dielectric material 22, such as TEOS silicon dioxide, for isolation of the transistor of FIG. 1 from adjacent structures such as other bipolar transistors or MOS structures Other materials such as undoped polysilicon may be used to fill the isolation trench, or a combination of materials including a layer of undoped polysilicon underlying a layer of TEOS oxide It should be noted that the trench holding dielectric 22 adds little process complexity since a trench is being etched for provision of the subcollector 14 anyway. It should of course be noted that conventional planar isolation, such as local oxidation (LOCOS) or modified LOCOS as described in U.S. Pat. No. 4,541,167 issued Sep. 17, 1985 and assigned to Texas Instruments Incorporated, may be alternatively used in place of dielectric 22 in the trench.

Figure 2:
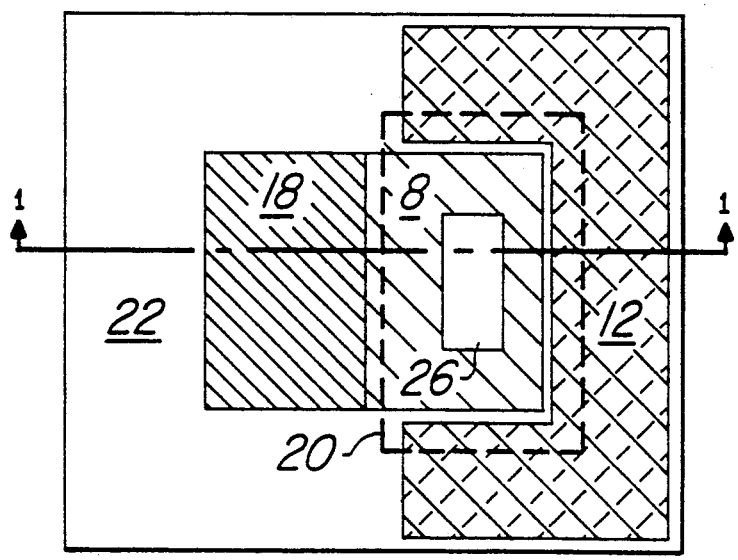
FIG. 2 is a plan view of the transistor of FIG. 1

Referring now to FIG. 2, a plan view of the structure of FIG. 1 is now shown. In this example, the trench filled with either polysilicon plug 12 or with oxide 22 surrounds the active transistor region shown by extrinsic base 18 and intrinsic base 8. Emitter electrode 20 is shown in phantom, overlapping onto polysilicon plug 12; emitter via 26 is also shown to indicate the placement of the emitter region in base 8.

Figure 3A:
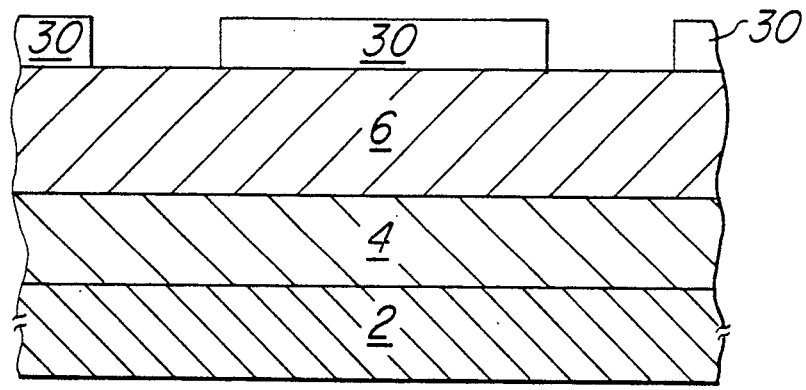
FIGS. 3a through 3s are cross-sectional views of the transistor of FIG. 1 at various steps in its formation.
Figure 3B:
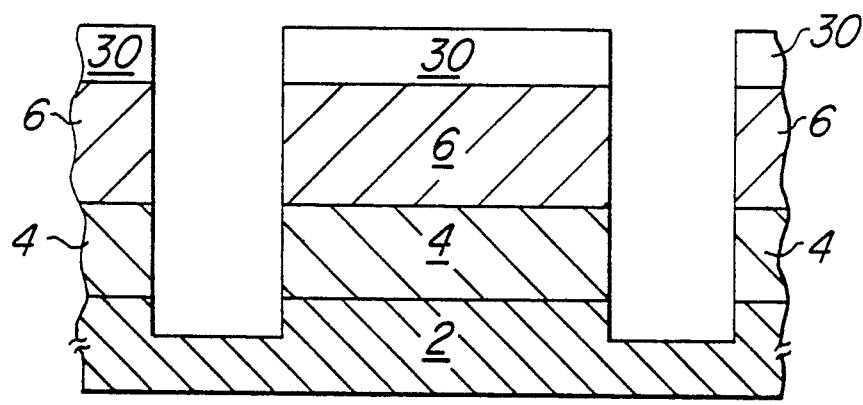
Figure 3C:
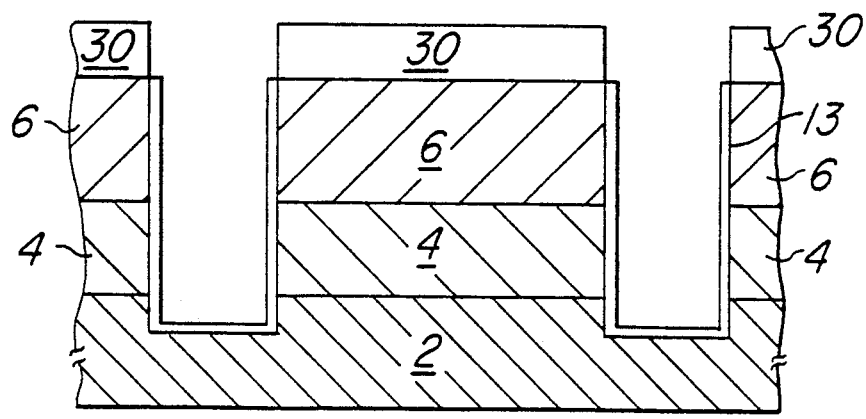
Figure 3D:
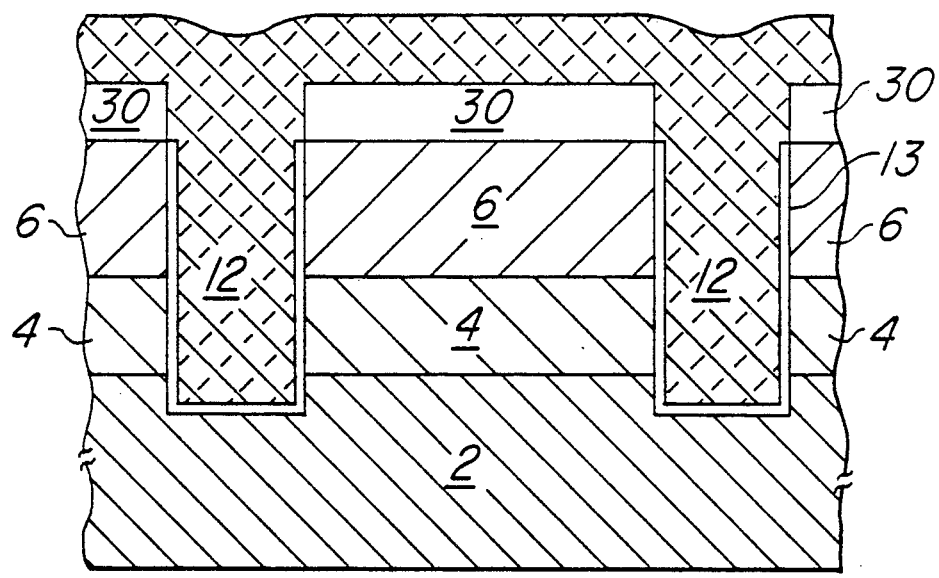
Figure 3E:
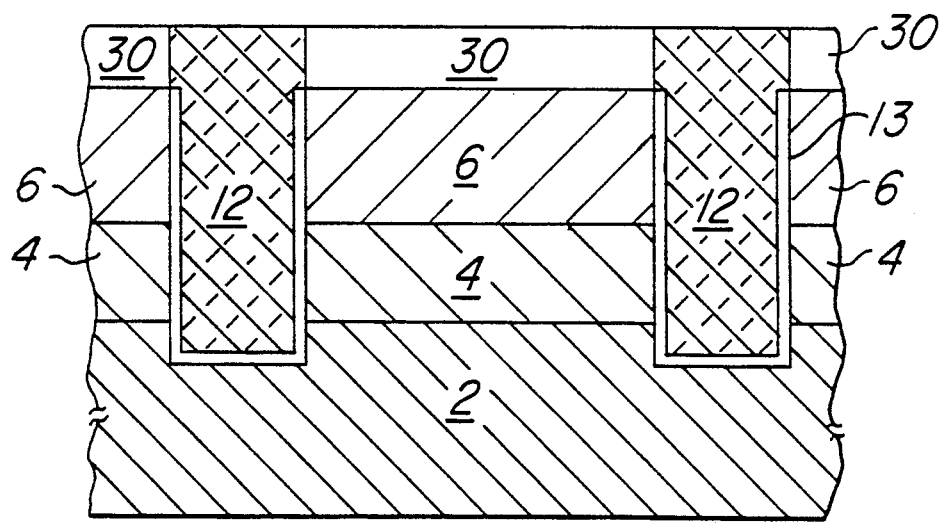
Figure 3F:
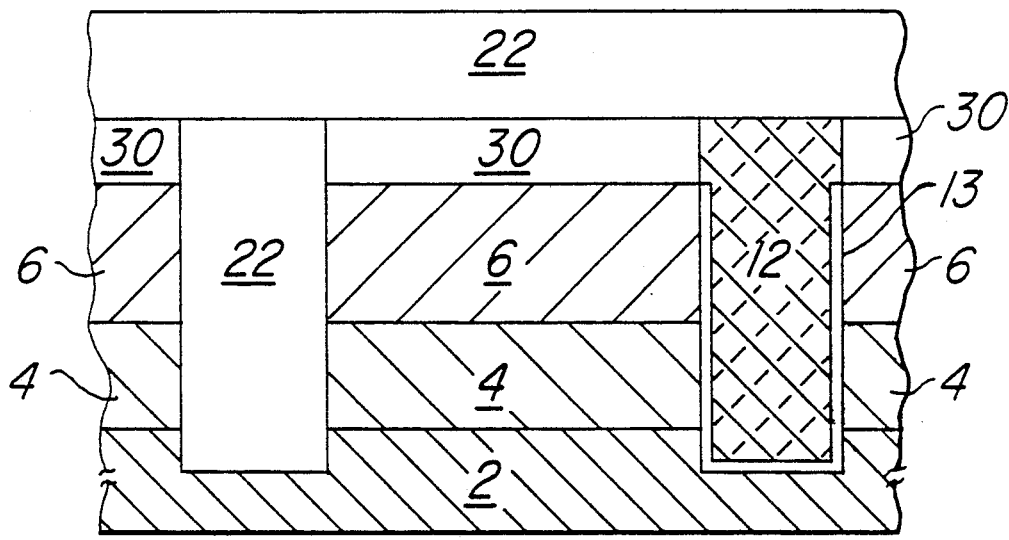
Figure 3G:
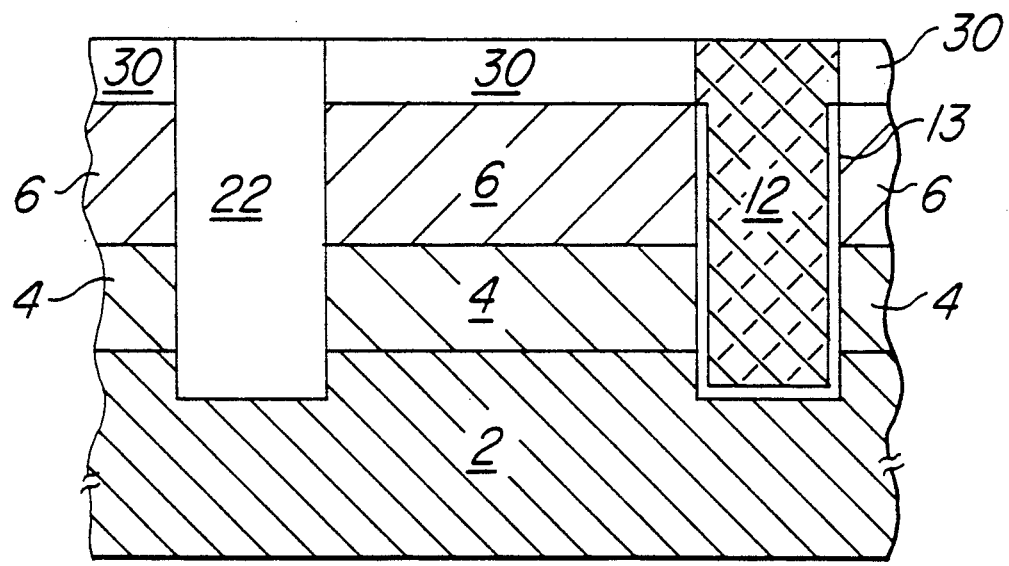
Figure 3H:
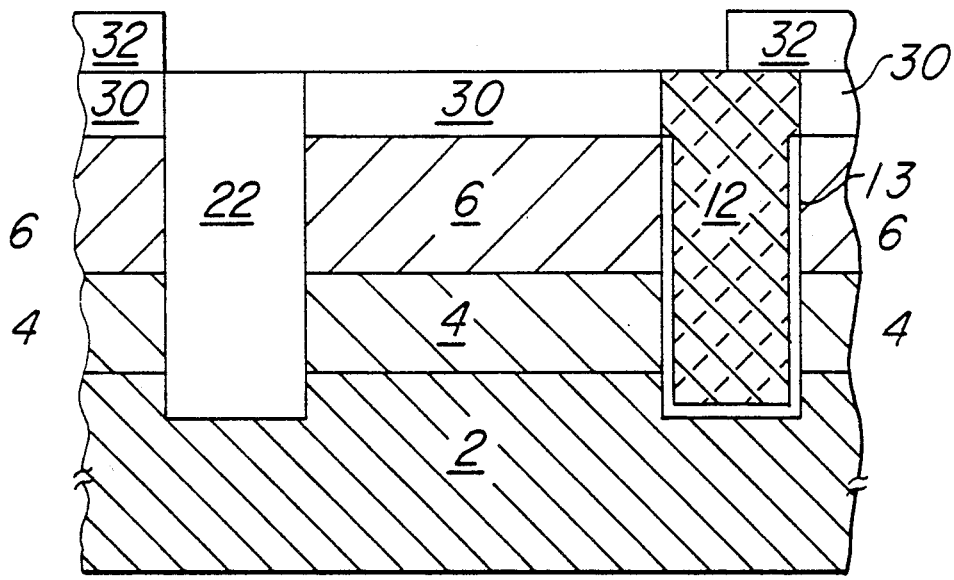
Figure 3I:
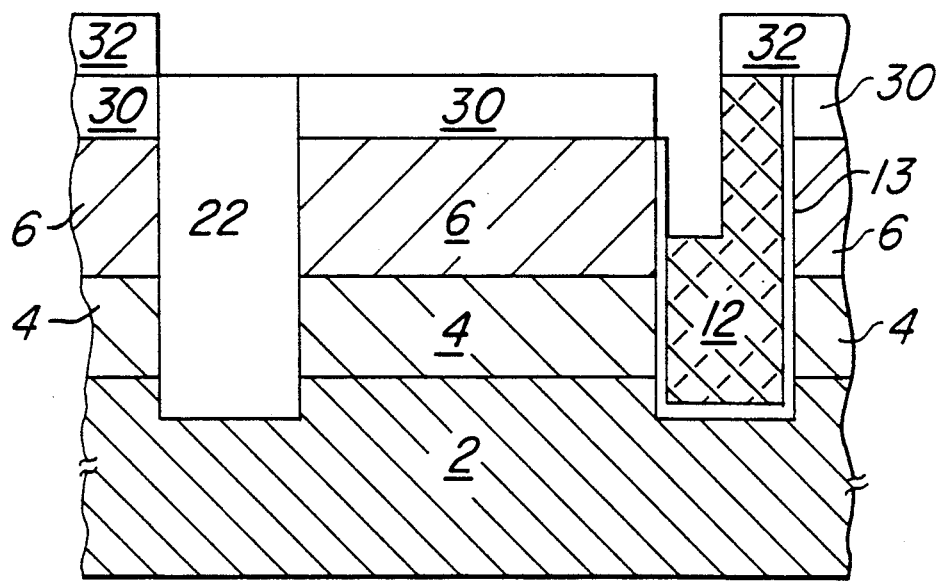
Figure 3J:
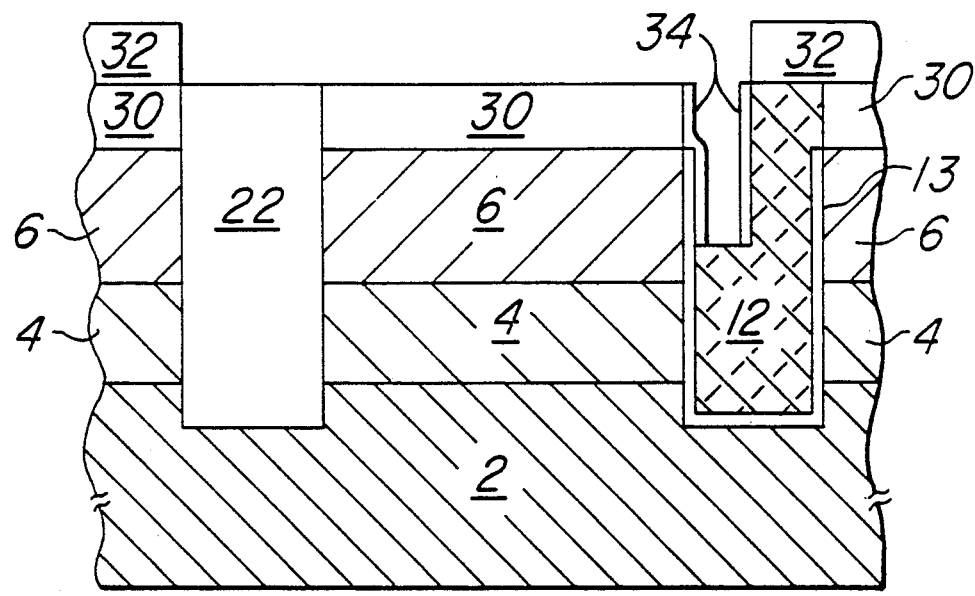
Figure 3K:
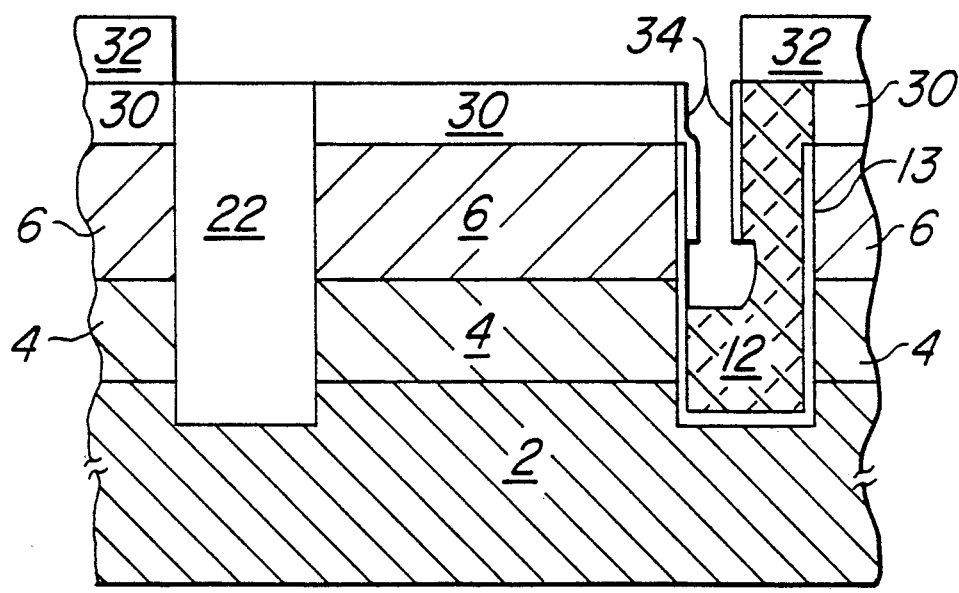
Figure 3L:
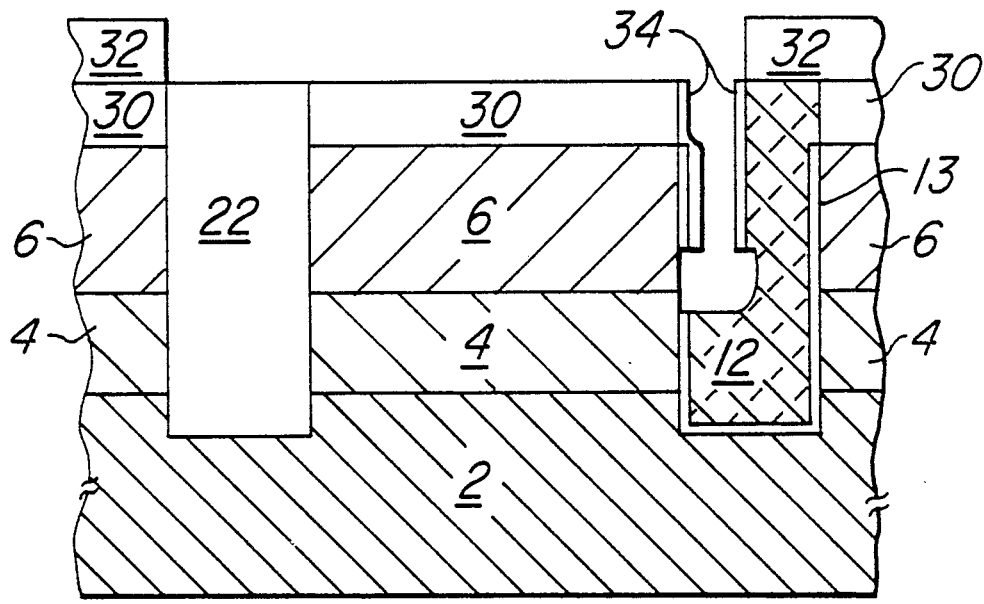
Figure 3M:
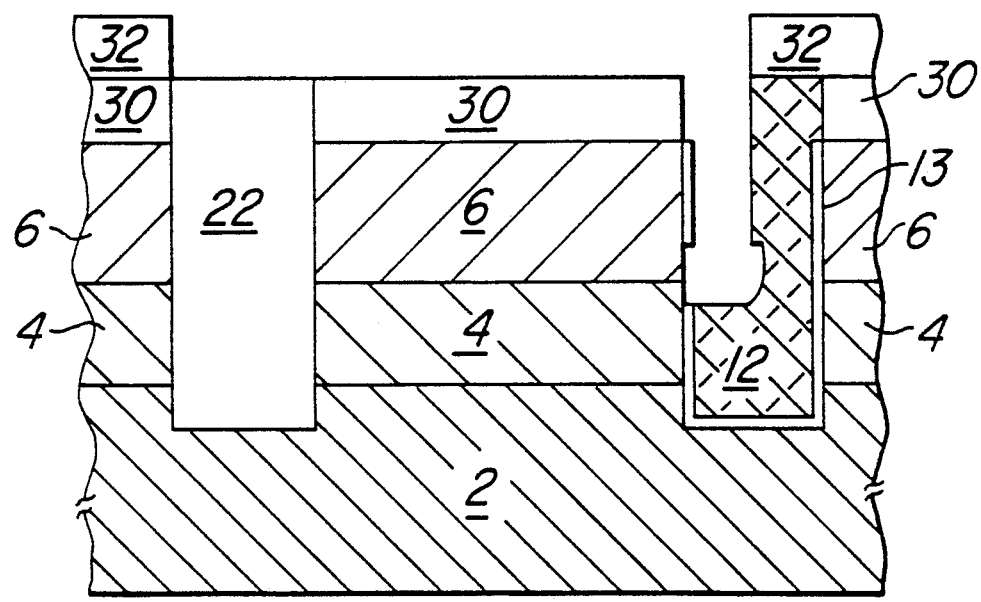
Figure 3N:
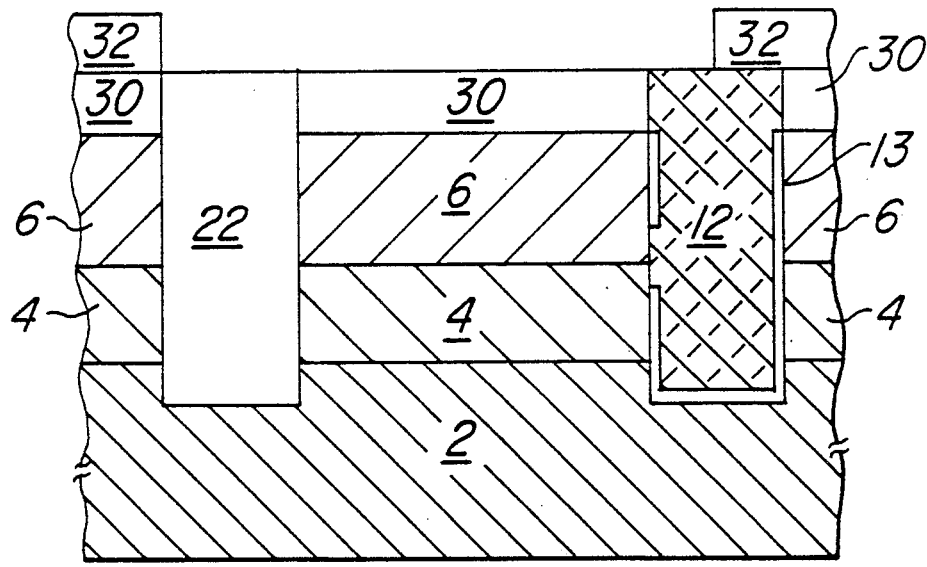
Figure 3O:
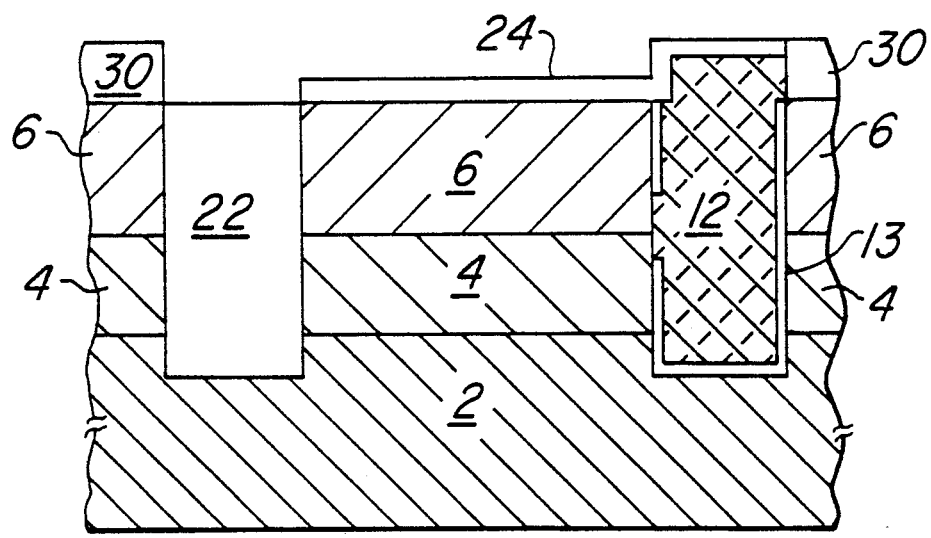
Figure 3P:
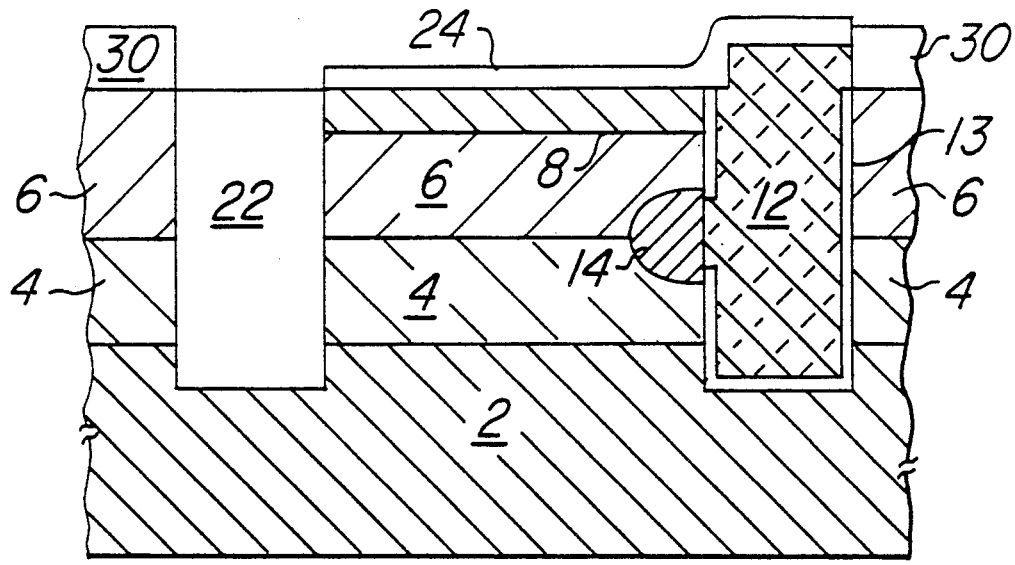
Figure 3Q:
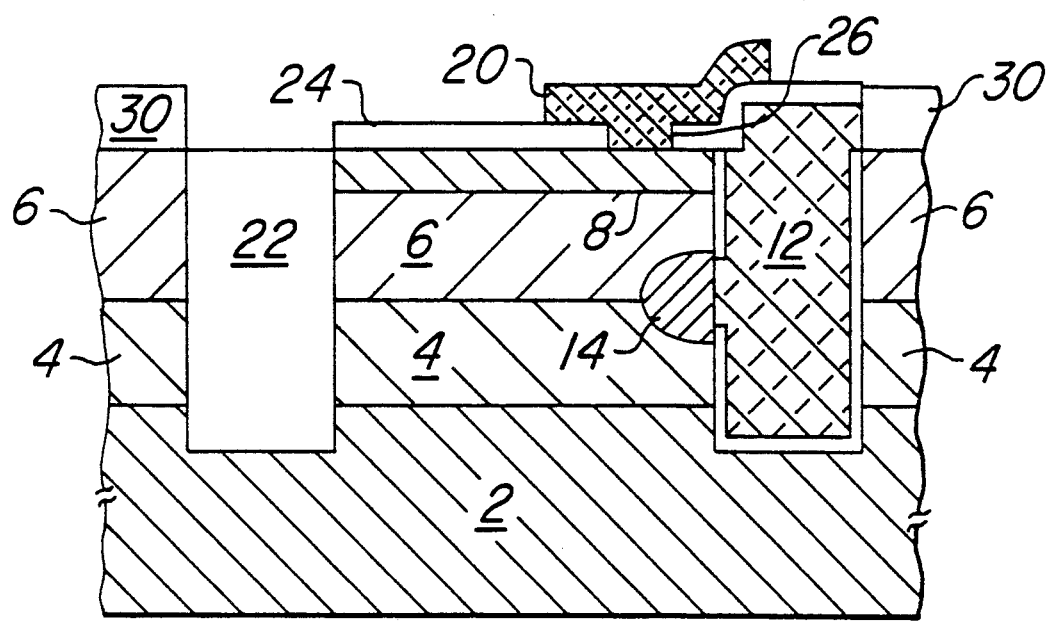
Figure 3R:
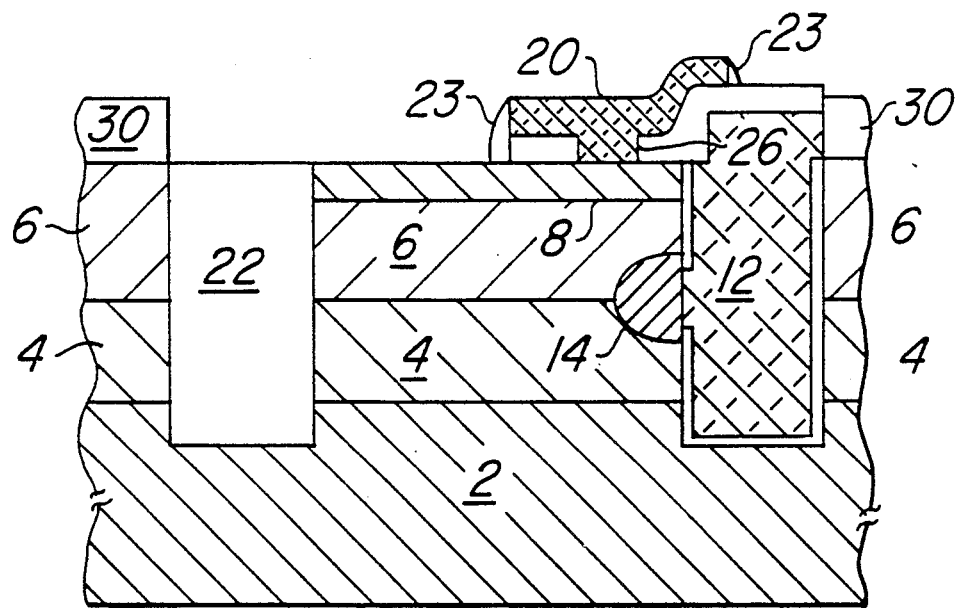
Figure 3S:
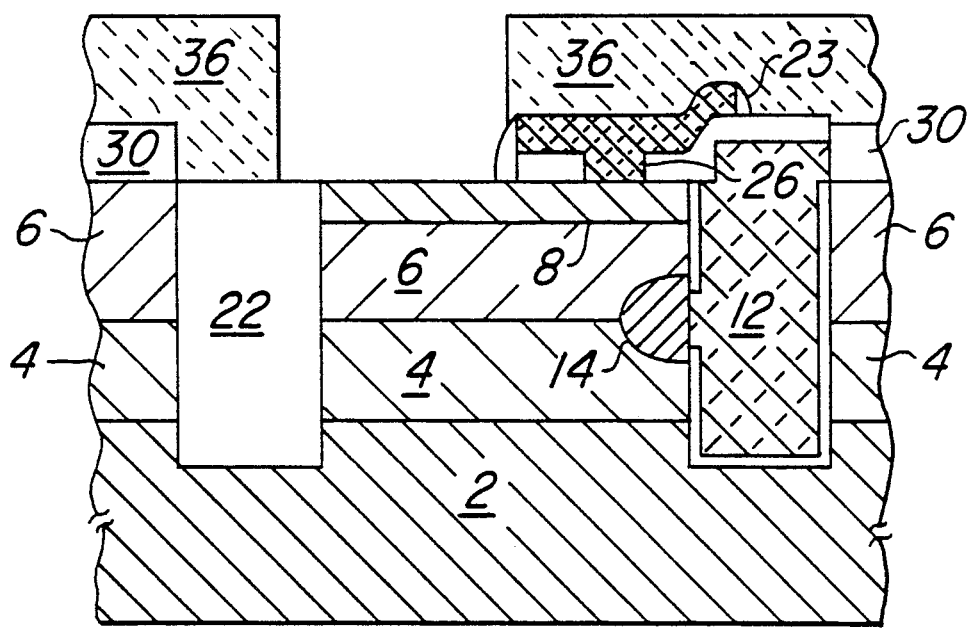

Referring now to FIGS. 3a through 3s, an exemplary sequence of process steps used in the formation of the transistor of FIGS. 1 and 2 will be described in detail. In FIG. 3a, p+ substrate 2 is shown with p− epitaxial layer 4 grown thereupon. In this exemplary embodiment, epitaxial layer 4 is originally grown to a thickness on the order of 5 microns. Formed into epitaxial layer 4 by way of implant and diffusion is collector region 6, which extends from the surface to a depth on the order of 2 microns, in this embodiment. After the formation of collector region 6, p+ dopant from substrate 2 will have diffused upwardly into epitaxial layer 4. For the example described herein, the resultant structure of FIG. 3a has collector region 6 extending 2 microns from the surface, and the remaining p-portion of epitaxial layer 4 having a thickness on the order of 1 micron under collector region, with the other 2 microns of the original thickness of the epitaxial layer 4 now being p+ from the up-diffusion from substrate 2. Of course, the thicknesses described herein are merely exemplary, as the instant invention may be incorporated into structures of other dimensions and construction. As described above, collector region 6 is an n-type region which may also serve, in BiCMOS structures, as the n-well into which p-channel MOS transistors are formed. Overlying collector region 6 is a mask 30, which has been exposed by way of photolithography so that selected portions are removed as shown in FIG. 3a. The locations of the structure at which mask 30 is removed will be etched to form trenches, as will be described below. Mask 30 may consist of sufficently hardened photoresist to withstand the silicon etch used to form the trenches; however it is generally preferable to use a hard mask material such as deposited silicon dioxide as mask layer 30. As will be evident, the use of an oxide as mask layer 30 allows it to remain in place for subsequent processing steps.

It should be noted that, if a purely bipolar structure were to be formed according to the invention, the structure could be formed into a p-type substrate, rather than into a p-type epitaxial layer 4 grown on a p+ substrate 2 as shown in FIG. 3a. The instant invention is equivalently applicable to such a structure.

FIG. 3b illustrates the structure after the silicon etch used to form trenches at the locations of the surface of collector region 6 exposed by mask layer 30. The trenches are etched according to conventional techniques, and preferably extend through both collector region 6 and epitaxial layer 4, reaching p+ substrate 2. In this example, for the thicknesses described above, the depth of the trenches would be on the order of 3 to 4 microns. The width of the trenches is not particularly critical to the construction of the transistor according to the invention. For purposes of reducing surface area of the transistor, the trench width is preferably minimized; with current technology, a width on the order of 0.8 microns is acheivable, for example. It may be preferable, however, that the trench width be enlarged to accomodate a contact thereto, depending upon the available contact technology, or for ease in manufacturability of the structure. Accordingly, the width of the trenches can range from 0.8 microns to widths exceeding 2 microns.

It is desired that the regions of the structure on either side of the etched trenches be electrically isolated from one another. Since the trench is to contain a collector contact for an n-p-n transistor as shown in FIG. 1, the isolation must be sufficiently strong to isolate either side when the collector bias is presented on the collector contact (polysilicon plug 12 of FIG. 1). In the illustrated example, since substrate 2 is p+ doped, no channel stop implant is necessary at the bottom of each of the trenches and the isolation will be sufficient for the thicknesses of dielectric layer 13 used herein. If the structure is being formed into a p-type substrate, a channel stop implant of p-type impurities would strengthen the isolation at the bottom of each of the trenches As shown in FIG. 2, the trench is preferably etched in such a pattern as to surround an active region into which the transistor is to be formed.

Referring now to FIG. 3c, dielectric layer 13 is shown along the walls and the bottom of the trenches etched into substrate 2 from the surface. Dielectric layer 13 is preferably thermally grown silicon dioxide. The thickness of dielectric layer 13 is not critical, however, dielectric layer 13 should be sufficiently thick to maintain isolation at the bottom of the trench when collector bias is placed on polysilicon plug 12 (as shown in FIG. 1). In this example, dielectric layer 13 is on the order of 100 nm thick. After the growth of dielectric layer 13, a layer 12 of polysilicon is then deposited over the surface of the structure, filling the trenches as shown in FIG. 3d. Polysilicon 12 is heavily n-type doped for the n-p-n transistor of this embodiment; the doping may be done in-situ with the deposition, or the doping may be done by way of diffusion after ion implant or by phosphorous diffusion from a $POCl_3$ source. Of course, any common n-type dopant may be used for the doping of polysilicon 12. Arsenic may be preferred over phosphorous as the dopant for those applications of the invention where the subsequent diffusion of the subcollector must be more tightly controlled; either dopant is currently available for both implant and insitu doping of the polysilicon 12. Polysilicon 12 is then etched back to be cleared from the surface of oxide layer 30 as illustrated in FIG. 3e.

According to this first embodiment of the invention, oxide isolation is desired along the side of the transistor which will have extrinsic base region 18 formed thereat. Accordingly, a mask layer (not shown) is placed over the structure of FIG. 3e to protect polysilicon 12 in the trench on the right side, which will form a subcollector 14 as shown in FIG. 1, and to expose the trench on the left side of the structure in FIG. 3e. The polysilicon 12 is then etched away by way of a conventional etch which selectively etches polysilicon relative to silicon dioxide, until the trench is cleared. A layer 22 of silicon dioxide, such as formed by TEOS decomposition, is then deposited overall, filling the vacated trench. The resultant structure is shown in FIG. 3f; note that the dielectric layer 13 is illustrated as merged with oxide layer 22 in the left hand trench. Oxide 22 is then etched back to expose the top of polysilicon 12, as shown in FIG. 3g.

Referring now to FIG. 3h, the formation of the subcollector 14 begins by the formation of a mask layer 32 protecting a portion of polysilicon 12. Mask layer 32 may be formed of photoresist, but is preferably formed of deposited silicon dioxide either individually or underlying a layer of photoresist. Mask layer 32 is also shown in FIG. 3h as protecting the portions of collector region 6 outside of the trench, and as exposing oxide 30 overlying collector region 6 into which the base regions 8 and 18 will be formed. As will be described below, the locations over which hard mask layer 32 remains will be protected from the intrinsic base diffusion. Alternatively, if the mask layer 32 is not going to also serve as the intrinsic base mask, mask layer 32 may extend substantially over the collector region 6 for further protection thereof. The structure is then exposed to an anisotropic polysilicon etch, so that polysilicon 12 is etched to a depth in the trench which is above the interface between collector region 6 and p-type layer 4, as shown in FIG. 3i. The depth of this etch may be selected to optimize the performance of the transistor, as the depth of the etch determines the position of the top of subcollector 14. The etch depth should be positioned far enough below the position where intrinsic base 8 will be to reduce base-to-collector capacitance and increase the collector-to-base breakdown voltage, but close enough so that the series collector resistance of the length of collector region 6 between intrinsic base 8 and subcollector 14 will be minimized. It is contemplated that one of ordinary skill in the art can determine these parameters for the particular transistor under construction, and optimize the depth of the etch shown in FIG. 3i accordingly. This etch preferably selectively etches polysilicon relative to silicon dioxide, so that oxide layers 30 and 32 are not appreciably etched, and so that dielectric layer 13 at the exposed location is not appreciably etched.

Following the etch of polysilicon 12, a protective layer 34 is formed along the exposed side of polysilicon 12, and along the side of the exposed portion of dielectric layer 13 in the trench. Protective layer 34 may be silicon nitride, or densified TEOS silicon dioxide; the primary requirement of protective layer 34 is that it not be etched away by a polysilicon etch and an oxide etch so as to expose either polysilicon 12 or the protected dielectric layer 13 to the etches. Protective layer 34 is preferably formed by the deposition of the material, such as silicon nitride, followed by an anisotropic etch to remove the protective layer 34 from the top of the exposed polysilicon 12, resulting in the structure illustrated in FIG. 3j.

After the formation of protective layer 34, the structure is subjected to an isotropic polysilicon etch to further remove polysilicon 12 to a depth which will determine the bottom of subcollector 14. FIG. 3k illustrates the structure after such an etch, showing that a portion of dielectric layer 13, extending below protective layer 34, is exposed by the polysilicon etch. The bottom of subcollector 14 is preferably positioned at a point below the junction between collector region 6 and epitaxial layer 4; in the illustrated embodiment which uses a p+ substrate 2, the provision of a portion of the more lightly doped p-type epitaxial layer 4 provides for a buffer which reduces the capacitance between subcollector 14 and substrate 2. Following the isotropic polysilicon etch, the structure is subjected to an isotropic oxide etch, such as a wet etch by a 10% solution of HF, to remove the exposed portion of dielectric 13.

The resultant structure is shown in FIG. 3*l*. Protective layer 34 is then removed if desired, resulting in the structure shown in FIG. 3*m*. It should be noted that removal of protective layer 34 is not essential for the operability of the transistor, and that accordingly protective layer 34 may alternatively be left in place during subsequent processing.

The cavity in polysilicon 12 is then filled by the deposition of polycrystalline silicon, such polycrystalline silicon heavily doped either in-situ with the deposition, by subsequent implant and diffusion, or by POCl₃ phosphorous diffusion. As before, the polysilicon is etched back to clear of the surfaces of oxide layer 30, as shown in FIG. 3*n*. After refill of the trench, oxide layers 30 and 32 (to the extent remaining over collector region 6) are removed, and an oxide layer 24 is grown over collector region 6. Oxide layer 24, for this embodiment, is the oxide layer which will isolate the intrinsic base 8 from the emitter electrode 20. As described in said copending application Ser. No. 129,271, it is preferable that oxide layer 24 ranges from 60 to 150 nm in thickness; it should be noted that thinner thicknesses for oxide layer 24 may of course be used within the instant invention.

As shown in FIG. 3*o*, oxide layer 30 remains to some extent over the regions away from the location of the transistor of FIG. 1, due to the presence of oxide 32 as a mask layer remaining thereover from the steps of FIG. 3*k* in etching polysilicon 12. This oxide layer 30 will of course be increased in thickness by the growth of oxide layer 24. The presence of remaining oxide layer 30 allows for the p-type implant of the intrinsic base region 8 to be done without an additional mask step (i.e., a blanket implant may be used). It should additionally be noted that while FIG. 3*o* indicates that the edge of oxide layer 30 remains aligned with the edge of dielectric 22 filling the trench, such alignment resulting from the alignment of oxide layer 32 in FIG. 3*h*, this alignment is not critical. It may be preferable, from a process tolerance standpoint, that the edge of oxide layer 32 in FIG. 3*h* (and accordingly the edge of remaining oxide layer 30 in FIG. 3*o*) extend over dielectric 22 to ensure that the underlying silicon is not exposed to the base implant if not desired.

It should be noted that FIG. 3*o* illustrates that polysilicon 12 remains extending above the surface of collector region 6 after the removal of mask layer 32. If desired, polysilicon 12 could be etched back so as to be substantially coplanar with the surface of collector region 6. However, if the resulting topography is not unduly severe, polysilicon 12 may remain extending above the surface, and oxide layer 24 formed thereupon, as shown in FIG. 3*o*.

Referring to FIG. 3*p*, the structure is shown following the implant and diffusion of intrinsic base region 8. While this implant is shown as preferably done through oxide layer 24, as described in said copending application Ser. No. 129,271, it should be noted that any conventional technique for forming intrinsic base region 8 may alternatively be used. As described in said application Ser. No. 129,271, the intrinsic base region is formed by way of an ion implantation of a p-type dopant such as boron, followed by an anneal to diffuse the implanted dopant to the desired depth. The actual thicknesses and concentrations used for the formation of the intrinsic base region 8, as well as for the formation of the extrinsic base region 18 and emitter region 10 to be described hereinbelow, are not critical to the practice of the invention. Such thicknesses, concentrations, and other parameters described in said application Ser. No. 129,271 for these regions serve as an illustrative example thereof.

As shown in FIG. 3*p*, such diffusion also serves to diffuse n-type dopant from the heavily doped polysilicon 12 through the opening in dielectric 13, and into collector region 6 and also epitaxial layer 4, forming n+ subcollector 14. It should be noted that some amount of lateral diffusion will occur, so that subcollector 14 will be formed outside of the opening in dielectric 13. The position of the opening, in conjunction with the lateral diffusion, will determine the vertical placement of subcollector 14. The particular temperature and time for such diffusion is not critical, and may of course be designed and optimized for the particular transistor characteristics desired.

After formation of the intrinsic base region 8, the emitter may be formed. Contact 26 is first etched through oxide layer 24 at the desired location of the emitter diffusion. Since this example of the transistor according to the invention uses an autodoped emitter, a layer of n+ doped polysilicon is then deposited, patterned and etched to form emitter electrode 20 contacting intrinsic base region 8 through contact 26, as shown in FIG. 3*q*. Emitter electrode 20 is preferably deposited in undoped form, and subsequently doped by way of ion implant. According to this embodiment of the invention, emitter electrode 20 extends over polysilicon 12 used as the collector contact. Referring next to FIG. 3*r*, a layer of TEOS oxide is deposited and anisotropically etched in the conventional manner to leave sidewall filaments on the edges of emitter electrode 20. The provision of sidewall filaments 23 provides for isolation between emitter electrode 20 and collector contact 12, and between emitter electrode 20 and extrinsic base 18, in the event silicidation of the surfaces by way of the direct react silicide process is desired. In addition, sidewall filaments 23 allow an alternate method of self-aligned implant of the extrinsic base region 18 relative to emitter electrode 20 to be used, as described in copending applications Ser. No. 032,836 filed Mar. 31, 1987, and Ser. No. 057,871 filed June 2, 1987, both assigned to Texas Instruments Incorporated.

According to this embodiment of the invention, where extrinsic base 18 is formed prior to or without silicidation, extrinsic base region 18 may also be formed in a fully self-aligned manner. The provision of the sidewall oxide filaments 23 allows for a space between the edge of emitter electrode 20 and the underlying intrinsic base region into which the extrinsic base implant will be formed, and dielectric 22 in the trench allows self-alignment of the implant fully to the edge thereof. FIG. 3*s* illustrates the provision of a photoresist masking layer 36 for defining the portion of the structure which will receive the p+ implant for formation of extrinsic base 18. Subsequent to such implant, a high temperature anneal will be done to diffuse the implanted dopant of extrinsic base 18 to the desired depth. This anneal may also be used to diffuse n-type dopant from polysilicon emitter electrode 20 into intrinsic base 8, to form emitter region 10. The resultant structure is shown in FIG. 1. In this embodiment, extrinsic base region 18 is diffused fully through intrinsic base 8 to reach collector region 6. The structure of FIG. 1 is shown without silicide on extrinsic base 18, emitter electrode 20, and polysilicon 12.

It should be noted that additional diffusion of dopant from n+ polysilicon 12 through the opening in dielectric layer 13 will also occur during the diffusion of extrinsic base 18 and emitter region 10, as well as from the diffusion of intrinsic base 8 described above. Of course, the overall diffusion of dopant from n+ polysilicon 12 from all of these steps must be taken into account in determining the location and the size of the opening in dielectric layer 13, for the particular transistor formed according to the invention.

As shown in FIG. 1, the transistor formed according to this embodiment of the invention is advantageous in that there is no subcollector 14 which underlies the extrinsic base region 18. Accordingly, the parasitic collector-to-base capacitance is much reduced over the conventional buried collector bipolar transistor, where all structures in the bipolar transistor overly the buried subcollector region In addition, the provision of an isolation structure such as dielectric 22 provides surface area over which other unrelated structures such as polysilicon resistors, or contacts from one conducting layer to another, may be formed.

Figure 4:
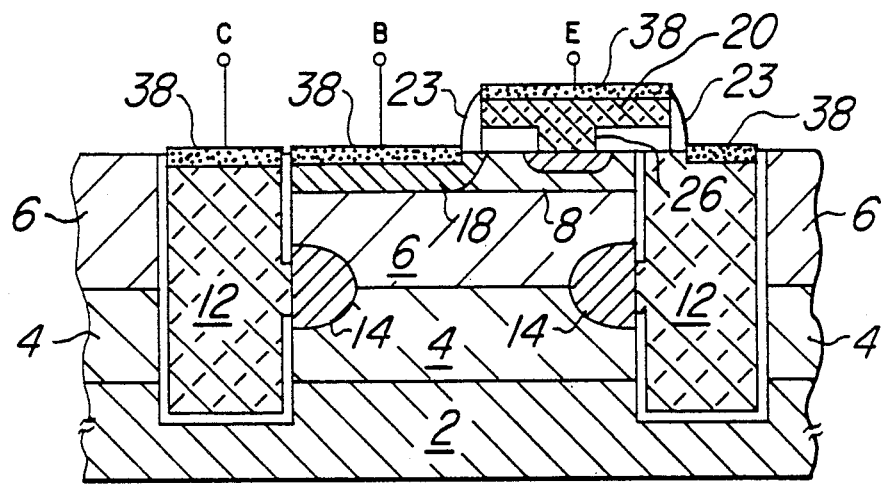
FIG. 4 is a cross-sectional view of a transistor formed according to a second embodiment of the invention.

However, the formation of the dielectric 22 in the trench on the side of the transistor with the extrinsic base 18 adds process steps, complexity and cost in the manufacture of the transistor. FIG. 4 illustrates a transistor according to a second embodiment of the invention which provides a lower cost method of formation in exchange for the provision of a subcollector region 14 under extrinsic base 18.

The transistor of FIG. 4 is formed in substantially the same manner as that of FIGS. 3a through 3s in arriving at the transistor of FIGS. 1 and 2. However, the steps of etching out a portion of the trench and refilling it with dielectric 22 illustrated in FIGS. 3f and 3g are of course not performed in the fabrication of the transistor of FIG. 4. Polysilicon 12 in the trench and subcollector 14 both surround the transistor region and, in this embodiment, are etched back so as to be substantially planar with the surface of the structure. As mentioned hereinabove, such planarization is not necessary in the practice of the instant invention. FIG. 4 also illustrates silicide film 38 formed on polysilicon 12, extrinsic base 18 and emitter electrode 20. Formation of such silicide is conventionally done by way of the deposition of a refractory metal layer over the structure, a high temperature reaction in an inert atmosphere so that the refractory metal forms a silicide where in contact with silicon, and the removal of the undesired portions of the refractory metal layer such as are formed over oxide.

It should be noted that the formation of extrinsic base 18 in the transistor of FIG. 4 may still be done in a self-aligned manner on all sides. Along the side of extrinsic base 18 near emitter electrode 20, either the method of a mask as shown in FIG. 3s, or the method described in copending applications Ser. No. 032,836 and Ser. No. 057,871 filed June 2, 1987, may be used. It should further be noted that the p+ implant for formation of extrinsic base 18 may be received by n+ polysilicon 12 in the trenches without adversely affecting the performance of the resultant transistor, as the lower concentration p+ implant will be unable to compensate the higher concentration n+ doping of polysilicon 12.

Figure 5:
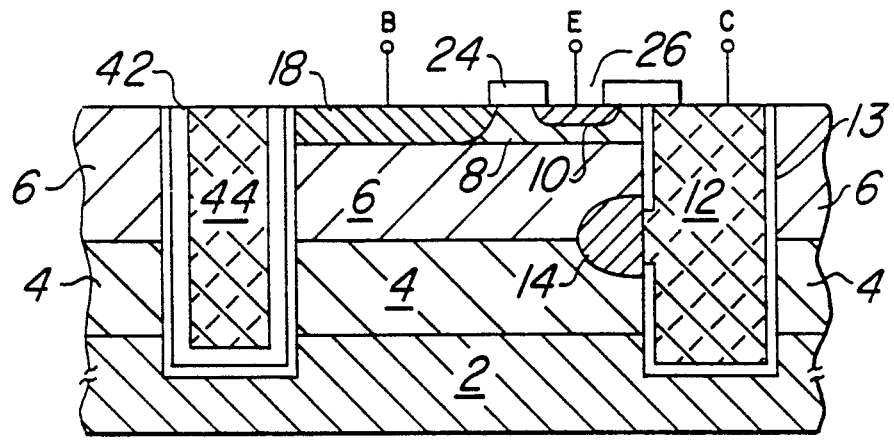
FIG. 5 is a cross-sectional view of a transistor formed according to a third embodiment of the invention.
Figure 6:
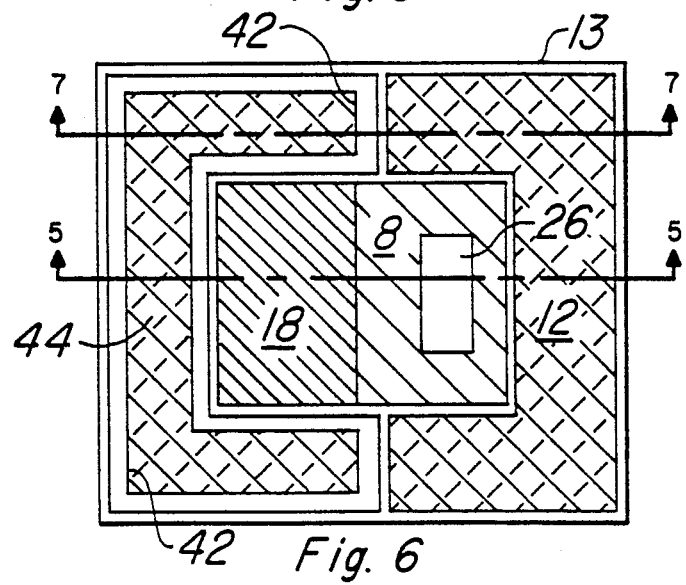
FIG. 6 is a plan view of the transistor of FIG. 5.
Figure 7:
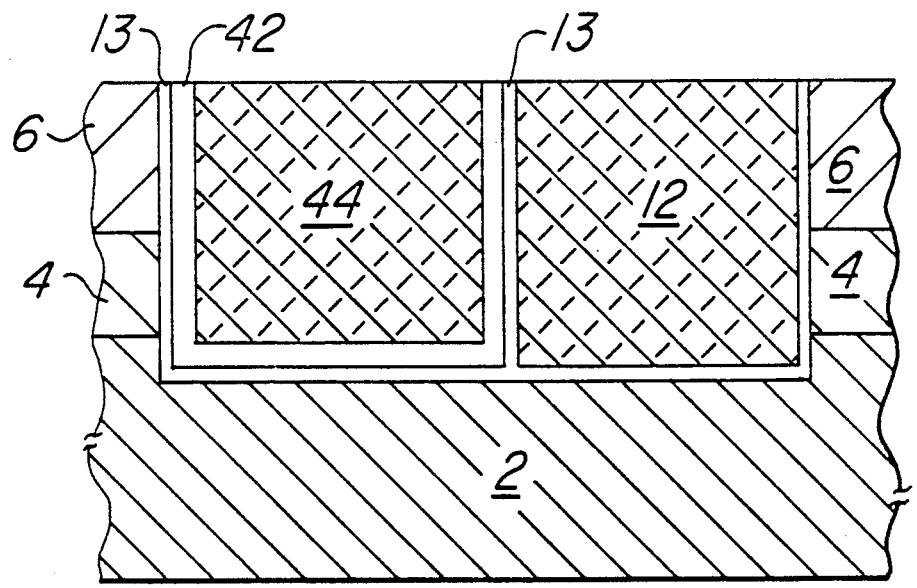
FIG. 7 is a cross-sectional view of the trench and isolation trench in the transistor of FIG. 5.

A third embodiment of the invention is illustrated in FIGS. 5, 6 and 7. Like reference numerals refer to similar components of the structure in FIGS. 5 through 7 as in the earlier Figures. The isolation structure of dielectric 22 of FIGS. 1 through 3s is replaced in the transistor according to this embodiment by a thick dielectric layer 42 and a polysilicon plug 44, as shown in FIG. 5. Polysilicon 12 etched out of a portion of the trench surrounding the transistor, preferably the side at which extrinsic base region 18 is to be formed; the plan view of FIG. 6 shows the locations of the isolation plug 44 relative to extrinsic base 18 and polysilicon 12 used for the collector contact. After removal of polysilicon 12 in this location, a thick dielectric layer 42 is deposited; an example of the dielectric is a TEOS oxide layer on the order of 100 nm thick. Dielectric layer 42 is preferably sufficiently thick so as to withstand the etch of dielectric layer 13 without other protection. Polysilicon 44 is subsequently deposited to fill the remainder of the trench, such polysilicon 44 being etched back so as to be cleared from the surface of the structure. It should be noted that the polysilicon 44 used to fill the remainder of the trench may be formed from the same polysilicon as used to refill the trench after formation of the opening of dielectric layer, illustrated in FIG. 3n. Oxide layer 42 and dielectric layer 13 provide isolation between polysilicon plug 44 and the neighboring collector region 6 and epitaxial layer 4, as shown in FIG. 5, and also between polysilicon plug 44 and polysilicon 12 which serves as the collector contact, as shown in the cross-section of FIG. 7.

It should be noted that FIG. 5 illustrates the formation of the emitter region in an alternative way to that of FIG. 1. The transistor of FIG. 5 utilizes the conventional method of direct diffusion of the emitter region 10 through via 26 in base oxide 24, as opposed to the autodoping method from polysilicon illustrated relative to the transistor of FIG. 1. Such construction is shown in FIG. 5 to illustrate that either method of emitter formation is applicable to the invention described herein. Other method for the formation of the emitter of the transistor, such as the polysilicon self-aligned emitter described in copending applications Ser. No. 149,785 filed Jan. 29, 1988, and Ser. No. 191,672 filed Apr. 15, 1988, both assigned to Texas Instruments Incorporated, may also alternatively be used in fabricating a transistor according to the invention.

Figure 8:
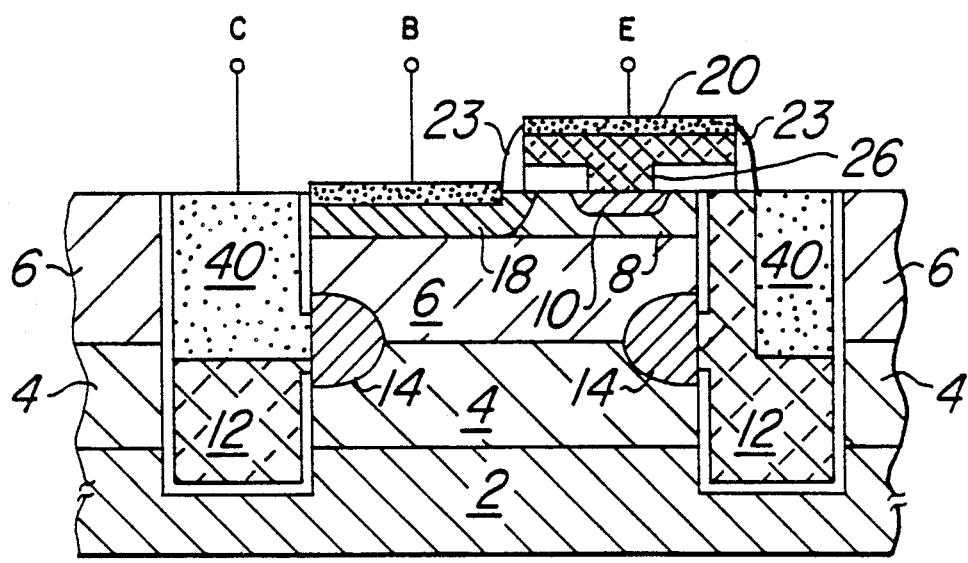
FIG. 8 is a cross-sectional view of a transistor formed according to a fourth embodiment of the invention.

Referring to FIG. 8, another embodiment of the invention is illustrated in cross-section. This embodiment of the invention incorporates, for purposes of example, the surrounding subcollector 14 of FIG. 4. This structure uses a refractory metal 40, such as tungsten, molybdenum, or any of the refractory metals, in the trenches for reduction of the series resistance of the collector contact. Refractory metal 40 may be provided by removing a portion of polysilicon 12 by way of an anisotropic etch and refilling with the refractory metal at any time subsequent to the formation of the opening in dielectric 13 through which dopant diffuses to form subcollector 14.

The provision of refractory metal 40 shown in FIG. 8 is preferably done after the formation of emitter electrode 20 and sidewall filaments 23, however. At this time in the formation of the structure (either prior to or after the diffusion of extrinsic base 18 and emitter region 10), subcollector regions 14 will have diffused from polysilicon 12 into collector region 6. An anisotropic polysilicon etch may then be done, masking emitter electrode 20 as well as other silicon structures of the transistor as necessary, to etch polysilicon 12 to a desired depth. The overlap of emitter electrode 20 over polysilicon 12 allows polysilicon 12 to maintain physical contact with the subcollector 14 near the active portion of the transistor directly under emitter region 10. Since subcollector regions 14 have already been diffused, the etch may extend to or below the depth of the opening in dielectric 13, as shown in FIG. 8. After the removal of polysilicon 12, refractory metal 40 may be formed. In the case of tungsten, the preferred method for such formation is the selective CVD of tungsten onto the exposed polysilicon 12; other methods, such as blanket deposition of the refractory metal and etchback may alternatively be used. The structure of FIG. 8 thus provides for reduced series collector resistance, due to the metal layer 40 disposed within the trenches. Extrinsic base 18 and emitter electrode 20 are preferably silicided as shown in FIG. 8.

It should be noted that the refractory metal 40 of FIG. 8 may be utilized in the embodiments of FIGS. 1 and 2, and FIGS. 5 through 7, to result in similar benefit as when applied to the embodiment of FIG. 4.

Figure 9:
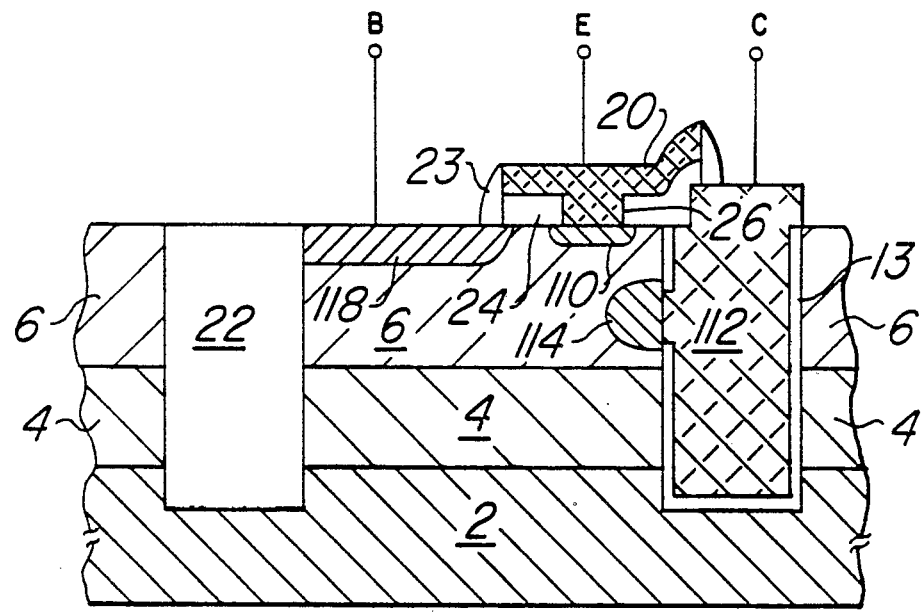
FIG. 9 is a cross-sectional view of a transistor formed according to a fifth embodiment of the invention.

Referring now to FIG. 9, another embodiment of a transistor incorporating the invention is illustrated in cross-section. The transistor of FIG. 9 is a p-n-p transistor which is formed into the structure having p+ substrate 2, p- epitaxial layer 4 and n-type region 6 as in the examples described hereinabove. Polysilicon plug 112 is formed in the same manner as described above in the formation of the transistor of FIG. 1, except that it is heavily doped p-type rather than n-type. The opening of dielectric layer 13 is placed above the interface between n-type region 6 and epitaxial layer 4, through which p-type dopant is diffused from polysilicon 112 to form a p-type collector region 114. For this embodiment, collector region 114 should not be in contact with epitaxial layer 4, so that each of the transistors formed according to this embodiment are isolated from the substrate 2. An extrinsic base region 118 is formed by the implant and diffusion of n-type dopant, similarly as p-type extrinsic base 18 of the transistor of FIG. 1. A p-type emitter region 110 is formed by autodiffusion of p-type dopant from polysilicon emitter electrode 20 (doped p-type), through contact 26 in oxide layer 24. The transistor of FIG. 8 thus has an n-type base formed by n-type region 6 in contact with extrinsic base 118, has p-type emitter region 110 and has a p-type collector region 114 which is diffused from the p-type doped polysilicon 112.

Of course, various alternative structures utilizing the invention may be used to form a p-n-p transistor, including the formation thereof on an n-type substrate and with other combinations of epitaxial layers, etc. The particular transistor of FIG. 9 is advantageous as it provides for a p-n-p transistor which may be formed into the same substrate, epitaxial layer, and well as used in the formation of the n-p-n transistors described hereinabove. It should be further noted that other modifications to the p-n-p transistor of FIG. 9 may be attractive, depending on the fabrication of other devices on the same substrate. For example, if the transistor of FIG. 9 is to be incorporated into a BiCMOS structure, p-type emitter region 110 may be formed by the same implant and diffusion as the p-type source/drain implant and diffusion for p-channel MOS transistors.

Figure 10:
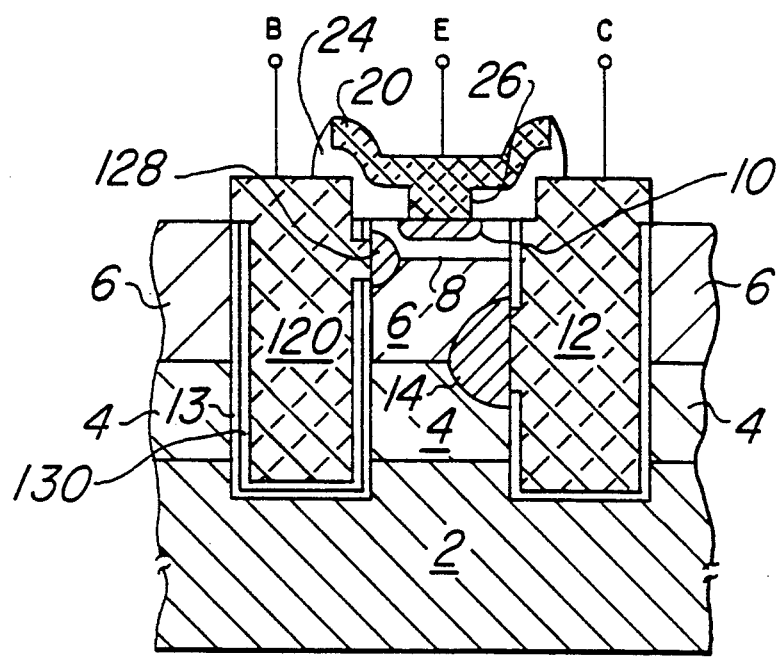
FIGS. 10 and 11 are cross-sectional and plan views, respectively, of a transistor formed according to a sixth embodiment of the invention.
Figure 11:
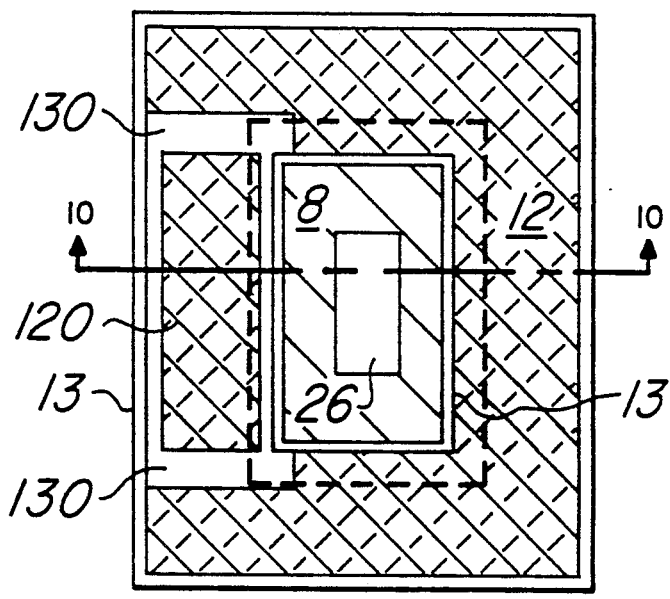

Referring now to FIGS. 10 and 11, incorporation of the invention into a transistor having a sidewall-diffused extrinsic base region is illustrated. FIG. 10 illustrates similar construction of the collector region 6, subcollector 14 and polysilicon plug 12, intrinsic base 8 and emitter region 10 as in the case of the embodiment of FIG. 1. On the opposite side of the transistor from the trench containing n-type polysilicon 12 is another trench within which is p+ doped polysilicon 120, separated from the surrounding substrate 2, epitaxial layer 4, and collector region 6 by dielectric layer 13, as in the case of polysilicon 12, and by an additional dielectric layer 130. An opening is provided in dielectric layers 13 and 130 a higher level than that for polysilicon 12, through which p-type dopant can diffuse from polysilicon 120 to form p+ extrinsic base region 128 in contact with intrinsic base 8. The formation of the higher opening for p-type polysilicon 120 than that for n-type polysilicon 12 is done in a similar manner as the opening for polysilicon 12, except at a later stage of the processing, with polysilicon 12 masked from the etching of polysilicon 120 used to form the opening in dielectric 13 (i.e., for steps analogous to those illustrated in FIGS. 3h through 3n). It should be noted that the provision of the sidewall diffused extrinsic base region 128 as shown in FIG. 10 allows for the formation of the transistor in reduced surface area as compared to that for the transistor of FIGS. 1 and 2, due to the incorporation of both the extrinsic base region 128 and isolation features of the filled trench in the same structure.

Referring now to FIG. 10, a plan view of the structure of FIG. 9 is shown. It is preferable that significant isolation be provided between p-type polysilicon 120 and n-type polysilicon 12, to minimize the base-to-collector capacitance that would result from only a thin dielectric layer (such as dielectric 13) separating the two plugs. As shown in FIG. 10, the additional dielectric layer 130 provides for such isolation between polysilicon plugs 12 and 120, similarly as dielectric layer 42 of FIG. 5.

To fabricate the structure of FIGS. 10 and 11, a trench surrounding the transistor would be etched and filled with n+ polysilicon 12 substantially as shown in FIG. 3e described above. A mask layer, preferably a silicon nitride hard mask, is placed over the surface of the structure, and polysilicon 12 is then etched from the location of the trench into which polysilicon 120 is to be formed, in a manner similarly as described hereinabove. Isolation dielectric 130 is then thermally grown at the exposed portions of polysilicon 12, with silicon nitride in the hard mask layer preventing substantial oxidation at the surface of the structure. Low temperature oxidation, such as on the order of 800 degrees Celsius, is preferable for the formation of dielectric 130 since the high doping concentration of polysilicon 12 will oxidize at a significantly greater rate than will the portions of epitaxial layer 4 and collector region 6. As a result, dielectric layer 130 is thicker along the sides of polysilicon 12 than along the side of the single crystal structure into which the transistor is to be formed, as is illustrated in FIG. 11. Polysilicon 120 is then deposited to fill the remaining portion of the trench, with the etchback process for forming the opening through which the p-type dopant diffuses similar as that described relative to FIGS. 3h through 3n. Of course, other techniques for isolating the polysilicon plugs 12 and 120 from one another may alternatively be used, including the use of a non-continuous trench with LOCOS isolation between the portions of the trench, or the use of a plug oxide (such as plug oxide 22 of FIGS. 1 and 2) disposed between the two plugs 12 and 120.

It should of course be further noted that a transistor could alternatively be formed using an extrinsic base region 128 formed as shown in FIG. 10 in conjunction with a conventional buried layer subcollector.

Although the invention has been described in detail herein with reference to its preferred embodiments, it is contemplated that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A bipolar transistor without a buried collector layer and formed at a surface of a semiconducting body, said transistor comprising:
   a collector region of a first conductivity type;
   a base region of a second conductivity type;
   an emitter region of said first conductivity type;
   a collector contact formed in a trench extending from said surface to said collector region;
   a dielectric surrounding said collector contact in said trench, said dielectric having an opening adjacent said collector region; and
   a subcollector of said first conductivity type directly electrically connecting said collector region to said collector contact through said opening in said dielectric without connection to a buried collector layer.

2. The transistor of claim 1, wherein said collector contact comprises polycrystalline silicon doped to said first conductivity type.

3. The transistor of claim 1, wherein said collector region comprises a subcollector;
   wherein said collector region further comprises:
      a layer of said body doped with dopant of said first conductivity type, and in contact with said subcollector;
   wherein said base region disposed between said layer of said collector region and said surface;
   and wherein said layer is relatively lightly doped relative to said subcollector.

4. The transistor of claim 1, wherein said trench circumscribes a portion of said surface to define a mesa;
   and wherein said base region is disposed within said mesa.

5. The transistor of claim 4, wherein said collector contact is disposed in said trench on all sides of said mesa.

6. The transistor of claim 5, wherein the opening in the dielectric is in contact with the collector region on all sides of said mesa.

7. The transistor of claim 1, further comprising an extrinsic base region of said second conductivity type in contact with said base region.

8. The transistor of claim 1, further comprising:
   an emitter electrode comprising polycrystalline silicon in contact with said emitter region, said emitter electrode having a portion overlying said collector contact.

9. The transistor of claim 3, further comprising:
   a buffer layer of said second conductivity type underlying said layer of said collector region.

10. The transistor of claim 9, wherein the trench containing said collector contact extends to said buffer layer.

11. The transistor of claim 9, wherein said transistor is formed on a substrate of said first conductivity type, said substrate being more heavily doped than said buffer layer.

12. The transistor of claim 11, wherein the trench containing said collector contact extends to said substrate.

13. A bipolar transistor without a buried collector layer and formed at a surface of a semiconducting body, said transistor comprising:
   a collector region of a first conductivity type;
   a base region of a second conductivity type having a portion disposed between said collector region and said surface;
   an extrinsic base region disposed adjacent said base region; an emitter region of said first conductivity type having a portion disposed between said base region and said surface;
   a collector contact formed in a trench extending from said surface to said collector region;
   a dielectric surrounding said collector contact in said trench, said dielectric having an opening adjacent said collector region;
   a subcollector of said first conductivity type in contact with said collector region and said collector contact, and disposed adjacent said opening in said dielectric; and
   wherein said subcollector region is not directly under said extrinsic base region.

14. The transistor of claim 13, wherein said trench containing said collector contact circumscribes a portion of said surface to define a mesa;
   and wherein said base region is disposed within said mesa.

15. The transistor of claim 14, further comprising:
   an extrinsic base region in contact with said base region.

16. The transistor of claim 15, wherein said trench containing said collector contact has a portion adjacent said extrinsic base region.

17. The transistor of claim 16, wherein said trench containing said collector contact circumscribes a portion of said surface to define a mesa;
   and wherein said base region is disposed within said mesa.

18. The transistor of claim 16, wherein the portion of said trench adjacent said extrinsic base region contains an isolation structure.

19. The transistor of claim 18, wherein said isolation structure comprises silicon dioxide.

20. The transistor of claim 19, wherein said isolation structure further comprises a polysilicon plug.

21. The transistor of claim 13, wherein said collector contact comprises polycrystalline silicon.

22. The transistor of claim 21, wherein said collector contact further comprises a refractory metal.

23. The transistor of claim 22, wherein said refractory metal is tungsten.

24. A bipolar transistor without a buried collector layer and formed at a surface of a semiconducting body, said transistor comprising:
   a collector region of a first conductivity type;
   a base region of a second conductivity type;
   an emitter region of said first conductivity type;
   a base contact formed in a trench extending from said surface to said base region;
   a dielectric surrounding said base contact in said trench, said dielectric having an opening adjacent said base region; and
   an extrinsic base of said second conductivity type having a portion disposed within said base region adjacent said opening in said dielectric.

25. The transistor of claim 24, wherein said base contact comprises polycrystalline silicon doped to said second conductivity type.

26. The transistor of claim 25, wherein said extrinsic base is formed by diffusion of dopant from said base contact through said opening in said dielectric.

27. The transistor of claim 24, further comprising:
a collector contact formed in a trench extending from said surface to said collector region;
a dielectric surrounding said collector contact in said trench, said dielectric having an opening adjacent said collector region; and
a subcollector of said first conductivity type having a portion disposed within said collector region adjacent said opening in said dielectric.

28. The transistor of claim 27, wherein said collector contact comprises polycrystalline silicon doped to said first conductivity type.

29. The transistor of claim 28, wherein said subcollector is formed by diffusion of dopant from said collector contact through said opening in said dielectric.

* * * * *